(12) United States Patent
Duenser et al.

(10) Patent No.: US 9,641,137 B2
(45) Date of Patent: May 2, 2017

(54) ELECTRIC AMPLIFIER CIRCUIT FOR AMPLIFYING AN OUTPUT SIGNAL OF A MICROPHONE

(71) Applicant: ams AG, Unterpremstaetten (AT)

(72) Inventors: Wolfgang Duenser, Rapperswil-Jona (CH); Markus Bingesser, Eglisau (CH); Thomas Froehlich, Ottikon (CH)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/904,037

(22) PCT Filed: Jun. 27, 2014

(86) PCT No.: PCT/EP2014/063722
§ 371 (c)(1),
(2) Date: Jan. 8, 2016

(87) PCT Pub. No.: WO2015/003930
PCT Pub. Date: Jan. 15, 2015

(65) Prior Publication Data
US 2016/0164477 A1    Jun. 9, 2016

(30) Foreign Application Priority Data
Jul. 10, 2013    (EP) .................................... 13175882

(51) Int. Cl.
*H03F 99/00*    (2009.01)
*H03F 3/183*    (2006.01)
(Continued)

(52) U.S. Cl.
CPC ............... *H03F 3/183* (2013.01); *H03F 1/30* (2013.01); *H03F 3/181* (2013.01);
(Continued)

(58) Field of Classification Search
CPC .... H04R 3/00; H04R 19/04; H04R 2201/003; H04R 1/04; H04R 19/016; H04R 3/06;
(Continued)

(56) References Cited

U.S. PATENT DOCUMENTS 5,712,591 A    1/1998    Maag et al.
2008/0036540 A1    2/2008    Frohlich et al.

FOREIGN PATENT DOCUMENTS

DE    102007011715 A1    9/2008
DE    EP2549343    *    1/2013
(Continued)

OTHER PUBLICATIONS

Barbieri A., et al,, "100+ db A-Weighted SNR Microphone Preamplifier with on-chip Decoupling Capacitors", IEEE Journal of Solid-State Circuits, XP011470529, vol. 47, No. 11, Nov. 1, 2012, pp. 2737-2750.

*Primary Examiner* — Paul S Kim
*Assistant Examiner* — Norman Yu
(74) *Attorney, Agent, or Firm* — McDermott Will & Emery LLP (57) ABSTRACT

An electric amplifier circuit for amplifying an output signal of a microphone comprises a supply input terminal (V10) to apply a supply potential (VDDA) for operating the electric amplifier circuit and a differential amplifier (110) having a first input terminal (E110a) for applying the output signal of the microphone (20), a second input terminal (E110b) and an output terminal (A110) for outputting an amplified output signal (OUT) of the microphone (20). A feedback path (FP) is provided between the output terminal (A110) of the differential amplifier (110) and the second input terminal (E110b) of the differential amplifier (110). A charge supplying circuit (120) is coupled to the feedback path (FP) to supply an amount of the charge to the feedback path (FP) in dependence on the supply potential (VDDA). The amount of
(Continued)

charge supplied to the feedback path may be dependent on a change of the supply potential (VDDA).

14 Claims, 6 Drawing Sheets

(51) Int. Cl.
*H03F 1/30* (2006.01)
*H03F 3/181* (2006.01)
*H03F 3/45* (2006.01)
*H04R 1/04* (2006.01)
*H04R 29/00* (2006.01)

(52) U.S. Cl.
CPC ..... *H03F 3/45076* (2013.01); *H03F 3/45475* (2013.01); *H04R 1/04* (2013.01); *H03F 2200/03* (2013.01); *H03F 2203/45116* (2013.01); *H03F 2203/45136* (2013.01); *H03F 2203/45511* (2013.01); *H03F 2203/45512* (2013.01); *H03F 2203/45514* (2013.01); *H03F 2203/45521* (2013.01); *H03F 2203/45522* (2013.01); *H03F 2203/45528* (2013.01); *H03F 2203/45534* (2013.01); *H04R 2201/003* (2013.01)

(58) Field of Classification Search
CPC ........ H04R 17/02; H04R 3/005; H04R 3/007; H04R 1/326; H04R 21/02; H04R 2410/00; H04R 25/502; H04R 29/004; H03F 2200/03; H03F 3/181; H03F 1/26; H03F 2200/48; H03F 1/025; H03F 1/0266; H03F 1/0272; H03F 1/30; H03F 1/3211; H03F 2200/129; H03F 2200/135; H03F 2200/222; H03F 2200/294; H03F 2203/45116
USPC .......... 381/120, 174, 111, 114, 323, 58, 104, 381/113, 121, 55, 71.1; 330/260, 291, 330/297
See application file for complete search history.

(56) References Cited

FOREIGN PATENT DOCUMENTS

| | | |
|---|---|---|
| EP | 2237414 A2 | 10/2010 |
| EP | 2549643 A1 | 1/2013 |

* cited by examiner

ELECTRIC AMPLIFIER CIRCUIT FOR AMPLIFYING AN OUTPUT SIGNAL OF A MICROPHONE

TECHNICAL FIELD

The invention is directed to an electric amplifier circuit for amplifying an output signal of a microphone, such as a MEMS (micro electromechanical system) microphone. The invention further concerns a microphone chip including a MEMS microphone.

BACKGROUND

A microphone chip, such as a MEMS microphone chip, has a package in which a microphone is coupled to an electric amplifier circuit for amplifying an output signal of the microphone. The electric amplifier circuit may be configured as an integrated circuit and particularly as an ASIC (application-specific integrated circuit). The microphone is coupled to a sensitive input terminal of the amplifier circuit to apply the output signal of the microphone. The amplifier circuit amplifies the received output signal of the microphone and generates an amplified output signal at an output terminal of the amplifier circuit.

In order to operate the microphone a supply potential is applied to an outer terminal of the microphone chip. The outer terminal may be configured as a bond pad to apply the supply potential. The package of the microphone chip is usually constructed compactly and is cost-optimized so that a direct coupling from the supply bond pad to the sensitive input terminal of the amplifier circuit cannot totally be avoided.

Microphones are often used in devices where the supply voltage is not well-controlled and many other devices use the same supply voltage. Thus, a good PSRR (power supply rejection ratio) is required for the audio band to guarantee no audible distortion due to supply changes. The capacitor of the microphone, such as a MEMS motor capacitor, is only in the range of a few pico Farad. Even a parasitic capacitor having a small capacity can limit the PSRR.

It is desirable to provide an electric amplifier circuit for amplifying an output signal of a microphone where the coupling of a supply potential applied to a bond pad at the package to an input terminal of the amplifier circuit inside the package is compensated as far as possible to improve the PSRR. It is a further concern to provide a microphone chip including a microphone and an electric amplifier circuit for amplifying an output signal of the microphone where a coupling of a supply potential applied to a bond pad at the package of the microphone chip to the input terminal of the electric amplifier circuit inside the package is compensated as far as possible to improve the PSRR.

SUMMARY

An electric amplifier circuit for amplifying an output signal of a microphone is specified in claim 1.

According to an embodiment of an electric amplifier circuit for amplifying an output signal of a microphone, the electric amplifier circuit comprises a supply input terminal to apply a supply potential for operating the electric amplifier circuit, an input terminal to apply the output signal of the microphone and an output terminal to output an output signal of the amplifier circuit. The amplifier circuit further comprises a differential amplifier having a first input terminal for applying a first input signal, a second input terminal for applying a second input signal and an output terminal for outputting an output signal of the amplifier circuit, wherein the first input terminal of the differential amplifier is coupled to the input terminal of the amplifier circuit, and the output terminal of the differential amplifier is coupled to the output terminal of the amplifier circuit. The amplifier circuit comprises a feedback path being coupled between the output terminal of the differential amplifier and the second input terminal of the differential amplifier. The amplifier circuit may further comprise a charge supplying circuit for supplying a charge, wherein the charge supplying circuit is coupled to the feedback path. The charge supplying circuit is configured to supply an amount of the charge to the feedback path in dependence on a change of the supply potential.

The electric amplifier circuit is arranged together with the microphone inside a package of a microphone chip. The microphone chip may comprise an outer bond pad disposed at the outside of the package to apply the supply potential to operate the microphone and the electric amplifier circuit. The outer bond pad of the chip may be connected to a supply input terminal of the amplifier circuit inside the package. The differential amplifier may be coupled to the supply input terminal to be supplied by the supply potential to operate the differential amplifier for generating the output signal of the amplifier circuit in dependence on the applied first and second input signal of the differential amplifier.

The electric amplifier circuit may comprise a voltage and/or a current generator circuit to provide a bias voltage and/or a bias current to operate the microphone. The microphone may be arranged between a supply output terminal of the amplifier circuit to provide the bias voltage/current and the input terminal of the amplifier circuit. The voltage and/or current generator circuit is coupled to the supply input terminal of the amplifier circuit to be supplied with the supply potential. The voltage and/or current generator circuit generates the bias voltage and/or bias current with an unintentional dependence on a change of the supply potential applied to the outer bond pad and hence to the supply input terminal.

A change of the supply potential may be coupled to the input terminal of the amplifier circuit due to parasitic capacitors inside the package between the supply input terminal and the input terminal of the amplifier circuit. This coupling of the supply potential to the sensitive input terminal of the amplifier circuit results in a decrease of the PSRR of the amplifier circuit.

The charge supplying circuit may be coupled to a terminal for applying the supply potential to apply the amount of charge to the feedback path in dependence on the supply potential and, in particular, in dependence on a change of the supply potential. The amount of charge applied by the charge supplying circuit to the feedback path changes the potential at the second input terminal of the differential amplifier. The second input terminal of the differential amplifier may be configured as a negative input node of the differential amplifier.

The charge supplying circuit is configured to supply a charge so that the potential at its output terminal in the feedback path and hence the potential at the second input node of the differential amplifier is changed in the same manner as the potential is changed at the input terminal of the electric amplifier circuit or at the first input terminal of the differential amplifier. The dedicated path from the terminal of the charge supplying circuit to apply the supply potential to the negative input node of the differential amplifier enables that a supply change at the input terminal of the amplifier circuit only results in a change of the common input level of the differential amplifier. The transmission path between the terminal of the charge supplying circuit to apply the supply potential and the second (negative) input terminal of the differential amplifier constitutes a negative on-chip coupling path which enables to compensate the off-chip package coupling of the supply potential to the first input terminal, i.e. the positive input of the differential amplifier.

A microphone chip comprising the electric amplifier circuit with the improved PSRR is specified in present claim 14. According to an embodiment of the microphone chip, the chip comprises an electric amplifier circuit as described above, the microphone and a package. The microphone is connected to the supply output terminal and the input terminal of the amplifier circuit. The package has an outer terminal/bond pad to apply the supply potential. The amplifier circuit and the microphone are housed in the package.

It is to be understood that both the foregoing general description and the following detailed description present embodiments and are intended to provide an overview or a framework for understanding the nature and character of the disclosure. The accompanying drawings are included to provide a further understanding, and are incorporated into and constitute a part of this specification. The drawings illustrate various embodiments and, together with the description, serve to explain the principles and operation of the concepts disclosed.

DETAILED DESCRIPTION

Figure 1A:
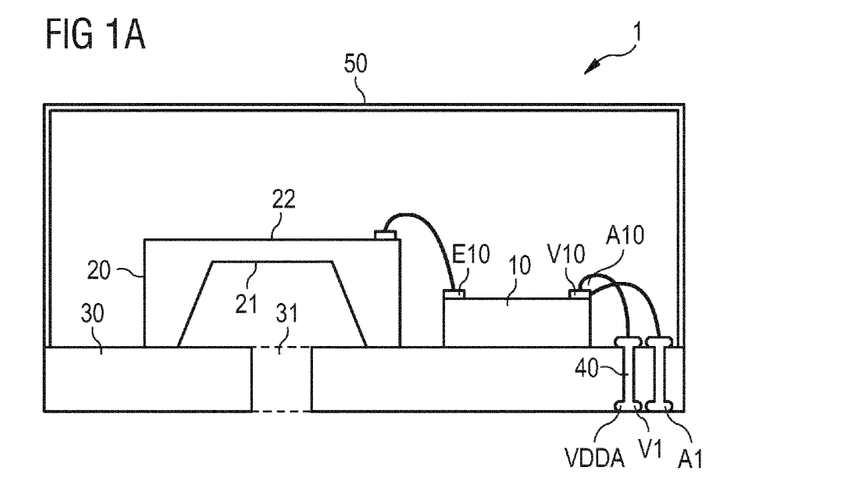
FIG. 1A shows an embodiment of a microphone chip comprising an electric amplifier circuit with an improved PSRR.
Figure 1B:
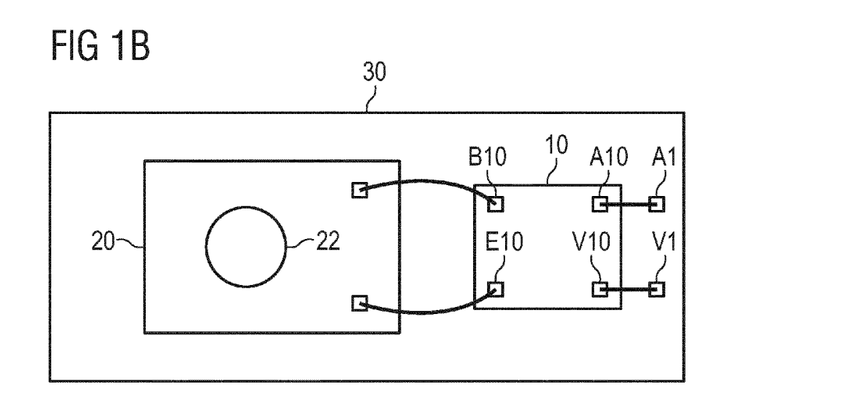
FIG. 1B shows a top view to the microphone chip.

FIGS. 1A and 1B show a side view and a top view of an embodiment of a microphone chip 1 including a microphone 20, an electric amplifier circuit 10 for amplifying an output signal of the microphone 20, a substrate 30 and a package 50. The microphone and the amplifier circuit are disposed on the substrate 30 and are encapsulated by the package 50. The microphone 20 may be configured as a MEMS (micro electromechanical system) microphone, and the electric amplifier circuit 10 may be configured as an ASIC (application-specific integrated circuit).

The microphone 20 comprises an acoustic-sensitive membrane 21 and a metallic plate 22 which are arranged in a changeable distance to each other. The distance varies in dependence on the acoustic pressure which influences the membrane by an opening 31 of the substrate 30 under the membrane 21. As a result, the capacitance of the microphone 20 changes in dependence on the acoustic pressure. The microphone 20 is connected to a (sensitive) input terminal E10 of the amplifier circuit 10 for receiving an output signal of the microphone. The microphone generates the output signal in dependence on the changed capacitance of the capacitor formed between the membrane 21 and the plate 22. The amplifier circuit 10 amplifies the received output signal of the microphone 20 and generates an amplified output signal at an output terminal A10 of the amplifier circuit which may be tapped at an output pad A1 of the microphone chip 1.

In order to operate the microphone 20 and the amplifier circuit 10, a supply potential VDDA may be applied to an outer terminal/supply bond pad V1 of the microphone chip 1 for applying the supply potential VDDA. The supply bond pad V1 may be disposed on the backside of substrate 30 of the package. The supply bond pad is coupled by via hole 40 to a supply input terminal V10 of the electric amplifier circuit 10. The electric amplifier circuit 10 comprises a supply output terminal B10 to provide a bias voltage/current to operate the microphone 20. The microphone 20 is coupled to the amplifier circuit 10 between the supply output terminal B10 and the input terminal E10 of the amplifier circuit.

The package of the microphone chip 1 may be constructed compactly and cost-optimally. Due to the design of the package a direct coupling of the supply potential VDDA from the supply bond pad V1 to the sensitive input terminal E10 of the amplifier circuit 10 cannot totally be avoided by the package.

Figure 2:
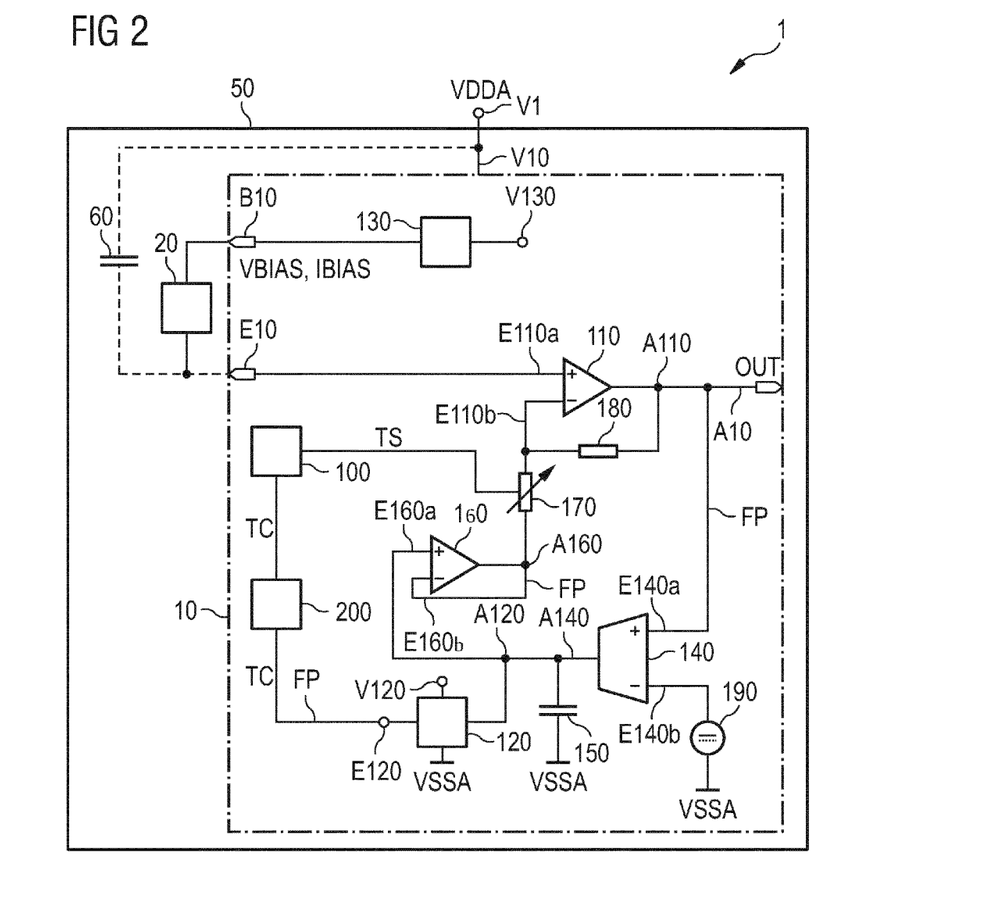
FIG. 2 shows an embodiment of an electric amplifier circuit for amplifying an output signal of a microphone.

FIG. 2 shows an embodiment of the electric amplifier circuit 10 being coupled to the microphone 20. The electric circuit 10 may be configured as an ASIC. The electric amplifier circuit comprises the supply input terminal V10 to apply the supply potential VDDA. The supply input terminal V10 is coupled to the supply bond pad V1 of the microphone chip 1 for applying the supply potential VDDA.

The electric amplifier circuit 10 comprises a voltage and/or current generator circuit 130 being coupled to the supply input terminal V10 to apply the supply potential VDDA. The voltage and/or current generator circuit 130 is configured to provide a bias voltage VBIAS and/or a bias current IBIAS at the supply output terminal B10 of the amplifier circuit 10 to operate the microphone 20. The microphone 20 is arranged between the supply output terminal B10 and an input terminal E10 of the amplifier circuit 10. During operation the microphone 20 generates an output signal applied to the input terminal E10 of the amplifier circuit 10. The amplifier circuit 10 is configured to amplify the output signal of the microphone 20 and to provide an amplified output signal at the output terminal A10 of the amplifier circuit.

The electric amplifier circuit 10 comprises a differential amplifier 110 having an input terminal E110a for applying a first input signal. The input terminal E110a is connected to the input terminal E10 of the microphone amplifier 10 which receives the output signal of the microphone 20. The input terminal E110a of the differential amplifier 110 may be configured as a positive input of the differential amplifier 110. The differential amplifier 110 comprises another input terminal E110b for applying a second input signal, and an output terminal A110 for generating an output signal OUT of the amplifier circuit. The output terminal A110 of the differential amplifier is connected to the output terminal A10 of the amplifier circuit 10.

The electric amplifier circuit 10 comprises a feedback path FP being coupled between the output terminal A110 of the differential amplifier 110 and the input terminal E110b of the differential amplifier 110. The electric amplifier circuit further comprises a charge supplying circuit 120 for supplying a charge to the feedback path FP. To this purpose, the charge supplying circuit 120 is coupled to the feedback path FP. The charge supplying circuit 120 is configured to supply an amount of the charge to the feedback path FP in dependence on the supply potential VDDA and hence, particularly, in dependence on a change of the supply potential VDDA.

The electric amplifier circuit 10 comprises a transconductance amplifier 140 and a voltage follower 160 which are both arranged in the feedback path FP between the output terminal A110 of the differential amplifier 110 and the input terminal E110b of the differential amplifier 110. The transconductance amplifier has a first input terminal E140a to apply a first input signal, a second input terminal E140b to apply a second input signal and an output terminal A140 to generate an output signal. The output terminal A140 of the transconductance amplifier is coupled, for example directly connected, to the second input terminal E110b of the differential amplifier.

According to an embodiment of the electric amplifier circuit, the first input terminal E140a of the transconductance amplifier 140 is connected to the output terminal A110 of the differential amplifier 110 and the second input terminal E140b of the transconductance amplifier 140 is connected to a voltage source 190 to apply a reference signal Vref to the input terminal E140b of the transconductance amplifier 140. The voltage source 190 is connected between the input terminal E140b of the transconductance amplifier 140 and a terminal to apply a reference potential VSSA.

The transconductance amplifier 140 is configured to generate an output signal of the transconductance amplifier at an output terminal A140 of the transconductance amplifier in dependence on the output signal OUT and the reference signal Vref. The input terminal E140a of the transconductance amplifier 140 may be configured as a positive input and the input terminal E140b of the transconductance amplifier 140 may be configured as a negative input of the transconductance amplifier.

The electric amplifier circuit 10 further comprises a capacitor 150 being connected between the output terminal A140 of the transconductance amplifier circuit 140 and the reference potential VSSA. The charge supplying circuit 120 is also coupled with its output terminal A120 for supplying a charge to the output terminal A140 of the transconductance amplifier 140.

The output terminal A140 of the transconductance amplifier 140 is connected to an input terminal E160a of the voltage follower 160. The voltage follower 160 comprises another input terminal E160b which is coupled to an output terminal A160 of the voltage follower 160. The output terminal A160 of the voltage follower is coupled to the input terminal E110b of the differential amplifier 110. The voltage follower 160 is arranged in the feedback path FP between the transconductance amplifier 140 and the input terminal E110b of the differential amplifier 110. The input terminal E160a may be configured as a positive input and the input terminal E160b of the voltage follower may be configured as a negative input terminal.

In order to set the gain of the differential amplifier 110 the electric amplifier circuit 10 comprises a resistor 170 and a resistor 180. The resistor 170 is arranged in the feedback path FP between the output terminal A160 of the voltage follower 160 and the input terminal E110b of the differential amplifier 110. The resistor 180 is directly connected to the output terminal A110 of the differential amplifier 110 and the input terminal E110b of the differential amplifier 110. The differential amplifier 110 is configured such that the gain of the differential amplifier is dependent on the relationship between the respective resistance of the resistors 170 and 180. In order to set the gain the resistor 170 may be configured as a variable resistor.

The differential amplifier 110 is configured as a non-inverting amplifier. The output terminal A140 of the transconductance amplifier 140 is configured as a high impedance node. The voltage follower 160 ensures that the output terminal A140 is operated in a non-loaded state so that it can be ensured that nearly no current flows into the input side of voltage follower 160. The supply potential VDDA is coupled to the active components of the electric amplifier circuit to operate the active components. The differential amplifier 110, for example, is supplied by the supply potential VDDA to be operated for generating the output signal OUT in dependence on the signals applied to the input terminals E110a and E110b.

Due to parasitic effects of the package 50 of the microphone chip, a supply change of the supply potential VDDA may be coupled to the input terminal E10 of the amplifier circuit 10 by means of parasitic capacitor 60. The charge supplying circuit 120 is coupled to a supply terminal V120 to apply the supply potential VDDA. The charge supplying circuit 120 is configured to supply an amount of charge at the output terminal A120 to the feedback path FP in dependence on the supply potential VDDA.

If the supply potential VDDA changes, the potential of the input signal IN at the input terminal E10 of the electric amplifier circuit is also changed due to the parasitic coupling of the supply potential VDDA to the input terminal E10 by means of the parasitic capacitor 60. The charge supplying circuit 120 which is coupled to the supply potential VDDA by the supply terminal V120 supplies a charge at the output terminal A120 so that the potential at the output terminal A120 and hence the potential at the input node E110b of the differential amplifier are changed in the same manner as the potential is changed at the input terminal E10 of the electric amplifier circuit.

An increase or decrease of the potential at the output terminal A120 is transferred by means of the voltage follower 160 to the output terminal A160 of the voltage follower, wherein the output terminal A160 provides an analogue ground potential for the differential amplifier 110. Consequently, the change of the potential at the input terminal E10 of the amplifier circuit 10 or the input terminal E110a of the differential amplifier circuit 110 may be compensated by a similar change of the potential at the input node E110b. The amplifier circuit 110 enables that a change of the potential at the input terminal E10 or E110a is transferred into a change of the common input level of the differential amplifier 110.

As explained above, the gain of the differential amplifier 110 may be set by the relationship of each of the resistances of the resistors 170 and 180. One of the resistors, for example the resistor 170, may be formed as a resistor having a variable resistance which may be set by a control signal TS generated by a control circuit 100. The control circuit 100 may be coupled to a storage circuit 200 for storing a value TC, such as a trim code, for specifying the resistance of the variable resistor 170. The control circuit 100 generates the control signal TS for setting the resistance of the variable resistor 170 in dependence on the value TC stored in the storage circuit 200.

The charge supplying circuit 120 may have an input terminal E120 to apply the value TC, for example a trim code, for specifying the resistance of the variable resistor 170. The charge supplying circuit 120 may be configured to supply the amount of charge to the feedback path FP at the output terminal A120 in dependence on the control signal TS and thus in dependence on the value stored in the storage circuit 200 so that the amount of charge provided by the charge supplying circuit 120 at the output terminal A120 is dependent on the set gain of the differential amplifier 110.

Figure 3:
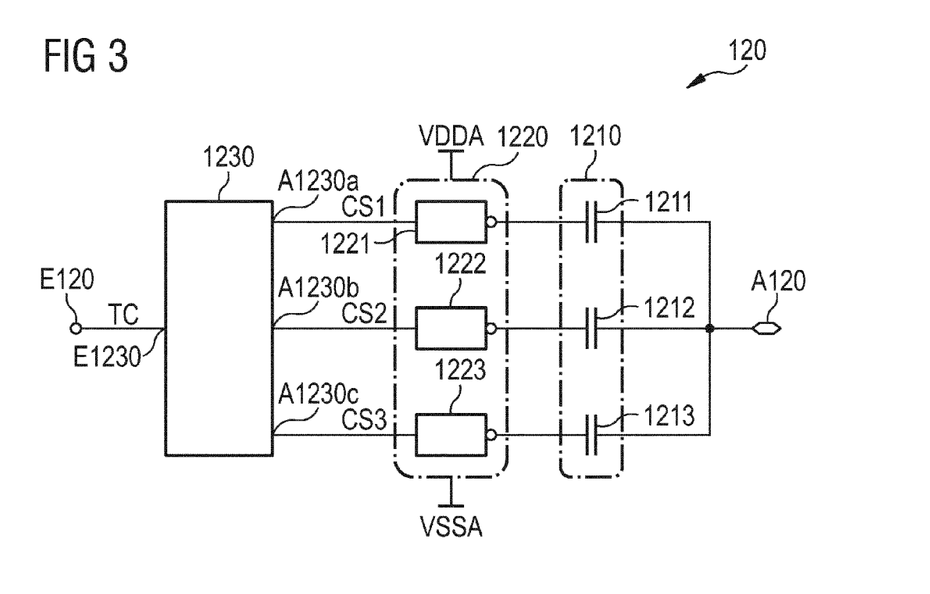
FIG. 3 shows an embodiment of a charge supplying circuit for supplying a charge to a feedback path of the electric amplifier circuit.

FIG. 3 shows an embodiment of charge supplying circuit 120 to provide an amount of charge at the output terminal A120 of the charge supplying circuit to the feedback path FP in dependence on the supply potential VDDA and the gain of the differential amplifier 110. The charge supplying circuit 120 comprises an electric storage circuit 1210 for storing the charge to be provided to the feedback path FP. The charge supplying circuit 120 is configured such that the amount of charge being stored within the electric storage circuit 1210 is dependent on the supply potential VDDA and the gain of the differential amplifier 110.

The electrical storage circuit may comprise a first capacitor 1211 and at least a second capacitor 1212 and a controllable switching circuit 1220. The controllable switching circuit 1220 is configured to selectively connect a first side S1211a of the first capacitor 1211 to one of the supply potential VDDA and the reference potential VSSA, and to also selectively connect the first side S1212a of the at least one second capacitor 1212 to one of the supply potential VDDA and the reference potential VSSA. The respective second side S1211b, S1212b of the first capacitor 1211 and the at least one second capacitor 1212 is coupled to the output terminal A120 of the charge supplying circuit.

Figure 4:
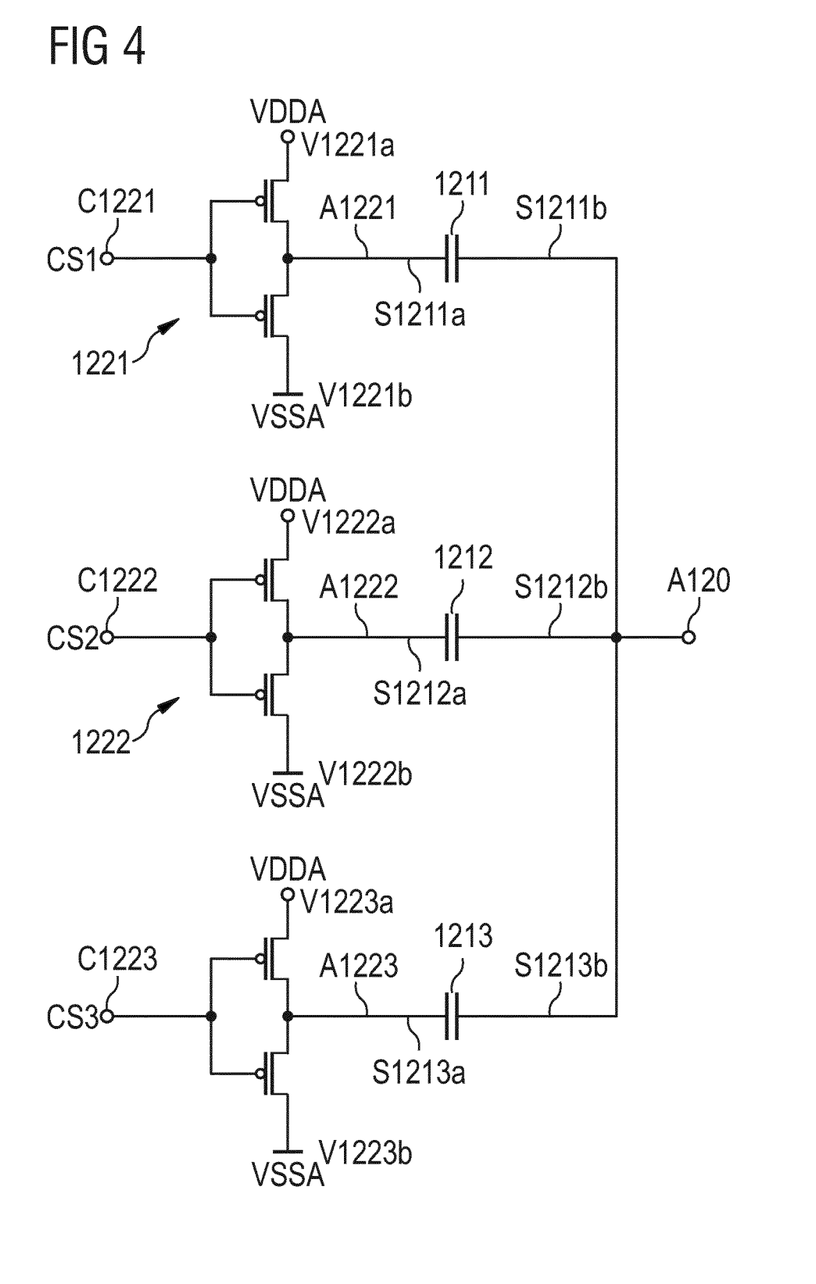
FIG. 4 shows an embodiment of a controllable switching circuit of the charge supplying circuit of the electric amplifier circuit.

In the exemplified embodiment of the charge supplying circuit 120 shown in FIGS. 3 and 4 the electric storage circuit 1210 comprises the capacitor 1211, the capacitor 1212 and the capacitor 1213. The capacitor 1211 has a first side S1211a coupled to the controllable switching circuit 1220 and a second side S1212b coupled to the output terminal A120. The capacitor 1212 has a first side S1212a coupled to the controllable switching circuit 1220 and a second side S1212b coupled to the output terminal A120. The capacitor 1213 has a first side S1213a coupled to the controllable switching circuit 1220 and a second side S1213b coupled to the output terminal A120.

The controllable switching circuit 1220 may comprise a plurality of inverters, wherein each inverter is connected between the supply potential VDDA and the reference potential VSSA and is controlled by a respective control signal. In the exemplified embodiment of the charge supplying circuit 120 shown in FIG. 3 the controllable switching circuit 1220 comprises an inverter 1221 controlled by a control signal CS1, an inverter 1222 controlled by a control signal CS2, and an inverter 1223 control by a control signal CS3.

The control signals CS1, CS2 and CS3 are generated by a control circuit 1230 of the charge supplying circuit 120. The control circuit 1230 generates the control signals CS1, CS2 and CS3 in dependence on the value TC stored in the storage circuit 200. The control circuit 1230 may comprise a decoder unit to decode the value TC, for example a trim code, and to generate the control signals CS1, CS2 and CS3 in dependence on the value/trim code TC. An input side of the control circuit 1230 may be coupled to the input terminal E120 of the charge supplying circuit 120 to apply the value TC read out of the storage circuit 200 by the control circuit 1230. Since the value TC stored in the storage circuit 200 specifies the gain of the differential amplifier 110, the control circuit 1230 generates the control signals CS1, CS2 and CS3 in dependence on the gain of the differential amplifier 110.

The control circuit 1230 may comprise a first output terminal A1230a to generate the control signal CS1, and at least a second output terminal A1230b to generate at least a second control signal CS2. The value TC of an input signal for the control circuit 1230 of the charge supplying circuit 120 received at the input side E1230 specifies the gain of the differential amplifier 110. The first output terminal A1230a of the control circuit 1230 of the charge supplying circuit is coupled to a control terminal C1221 of the inverter 1221. The inverter 1221 is configured to selectively couple one of the terminals V1221a, V1221b to apply the supply potential VDDA and the reference potential VSSA to the output terminal A1221 of the inverter 1221 in dependence on the control signal CS1.

The at least one second output terminal A1230b of the control circuit 1230 of the charge supplying circuit is coupled to a control terminal C1222 of at least a second inverter 1222. The at least one second inverter 1222 is configured to selectively couple one of the terminals V1222a, V1222b to apply the supply potential VDDA and the reference potential VSSA to the output terminal A1222 of the at least one second inverter 1222 in dependence on the control signal CS2.

In the exemplified embodiment of the charge supplying circuit 120 of FIGS. 3 and 4 the charge supplying circuit 120 comprises the inverter 1221, the inverter 1222 and the inverter 1223 having a respective terminal V1221a, V1222a and V1223a to apply the supply potential VDDA and a respective terminal V1221b, V1222b and V1223b to apply the reference potential VSSA. The inverter 1221 has an output terminal A1221 coupled to the side S1211a of the capacitor 1211. The inverter 1221 has a control terminal C1221 which is coupled to the output terminal A1230a of the control circuit 1230. The inverter 1221 is configured to selectively couple one of the terminals V1221a, V1221b to apply the supply potential VDDA and reference potential VSSA to the output terminal A1221 of the inverter 1221 in dependence on the control signal CS1 and thus in dependence on the gain of the differential amplifier 110.

The inverter 1222 has an output terminal A1222 coupled to the side S1212 of the capacitor 1212, and a control terminal C1222 which is coupled to the output terminal A1230b of the control circuit 1230. The inverter 1222 is configured to selectively couple one of the terminals V1222a, V1222b to apply the supply potential VDDA and the reference potential VSSA to the output terminal A1222 of the inverter 1222 in dependence on the control signal CS2 and thus in dependence on the gain of the differential amplifier 110.

The inverter 1223 has an output terminal A1223 coupled to the side S1213 of the capacitor 1213, and a control terminal C1223 for applying the control signal CS3, wherein the control terminal C1223 is coupled to the output terminal A1230c of the control circuit 1230. The inverter 1223 is configured to selectively couple one of the terminals V1223a, V1223b to apply the supply potential VDDA and the reference potential VSSA to the output terminal A1223 in dependence on the control signal CS3 and thus in dependence on the gain of the differential amplifier.

The electric storage circuit may have a capacitance Camp. The capacitance Camp of the electric storage circuit 1210 depends on the coupling of the side S1211a, S1212a and S1213a of the capacitors 1211, 1212 and 1213 with the supply potential VDDA and the reference potential VSSA. The capacitance Camp specifies the total capacitance of the capacitors 1211, 1212 and 1213 which are connected to the supply potential VDDA by the inverters 1221, 1222 and 1223. Since the coupling of the capacitors 1211, 1212 and 1213 to the supply and reference potential is dependent on the control signals CS1, CS2 and CS3 or in dependence on the value/trim code TC stored in the storage circuit 200, the capacitance Camp is dependent on the value/trim code stored in the storage circuit 200 and thus in dependence on the set gain of the differential amplifier 110. The target capacitance Camp of the electric storage circuit 1210 may be calculated by the formula:

$$C_{COMP}(TC) = \left(\frac{R_1(TC)}{R_2} + 1\right) \times \frac{C_P}{C_{MEMS} + C_{IN}} \times C_{FILTER}$$

In the formula $R_1$ specifies the resistance of the resistor 170, $R_2$ specifies the resistance of the resistor 180, $C_P$ specifies the capacitance of the parasitic capacitor 60, $C_{MEMS}$ specifies the capacity of the microphone 20, $C_{IN}$ specifies the input capacity of the electric amplifier circuit 10 and $C_{FILTER}$ specifies the capacitance of the capacitor 150.

Figure 5A:
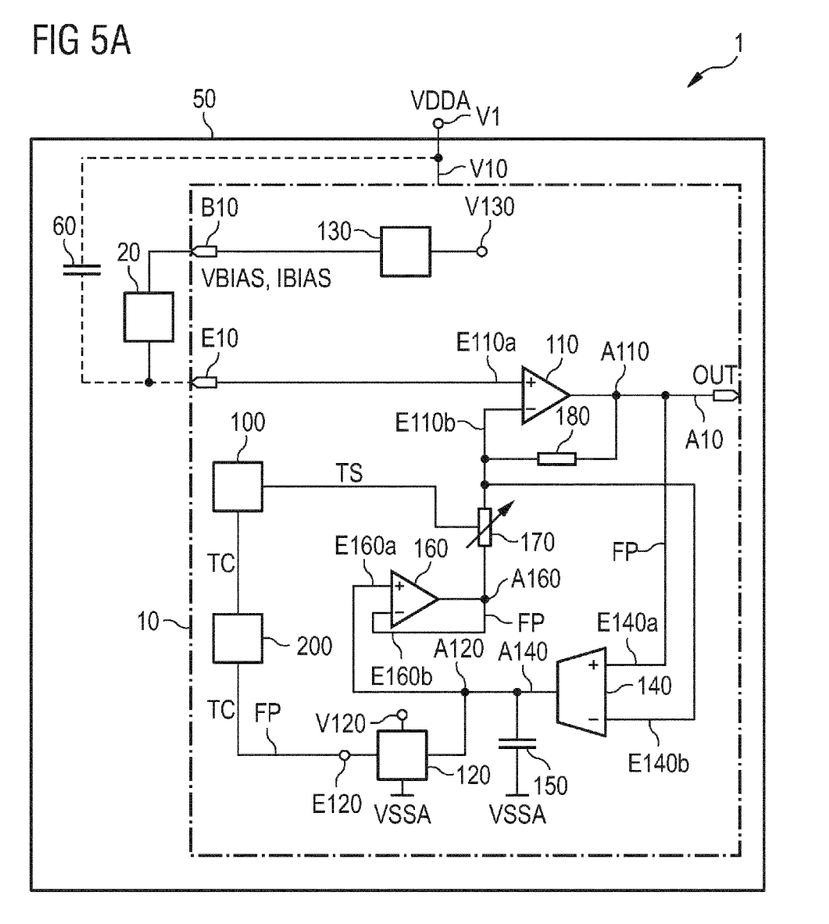
FIG. 5A shows another embodiment of an electric amplifier circuit for amplifying an output signal of a microphone.

According to another embodiment of the electric amplifier circuit shown in FIG. 5A, the first input terminal E140a of the transconductance amplifier 140 is connected to the output terminal A110 of the differential amplifier 110 and the second input terminal E140b of the transconductance amplifier 140 is connected to the input terminal E110b of the differential amplifier 110 to apply the reference signal Vref to the input terminal E140b of the transconductance amplifier 140.

Figure 5B:
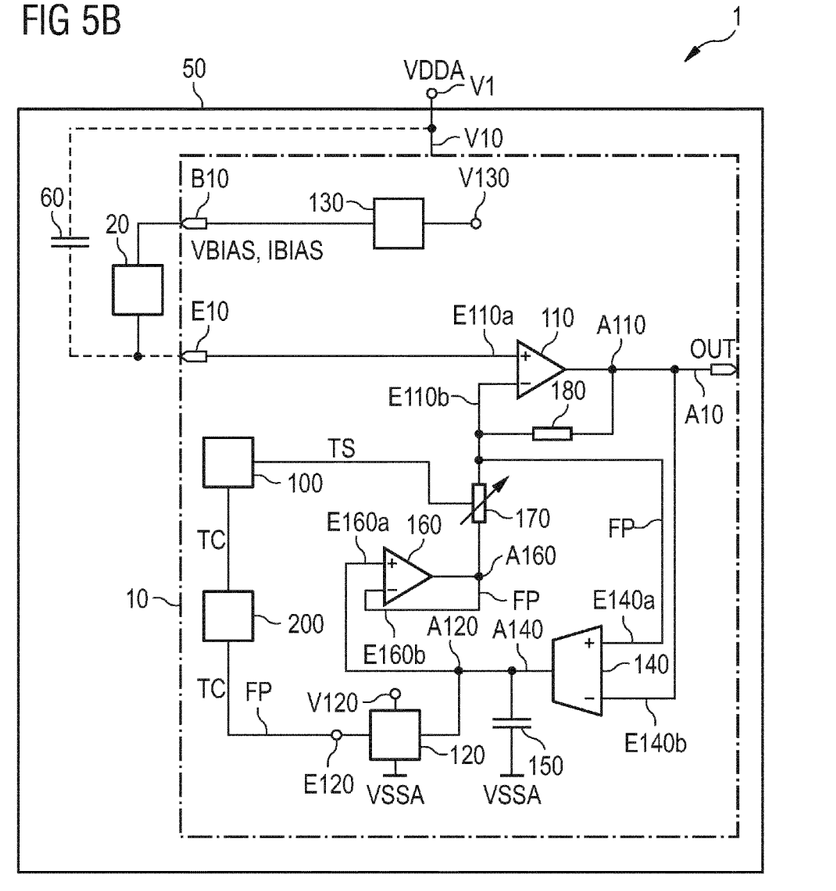
FIG. 5B shows another embodiment of an electric amplifier circuit for amplifying an output signal of a microphone.

FIG. 5B shows another embodiment of the electric amplifier circuit in which the first input terminal E140a of the transconductance amplifier 140 is connected to the input terminal E110b of the differential amplifier 110 and the second input terminal E140b of the transconductance amplifier 140 may be connected to the output terminal A160 of the voltage follower 160 to apply the reference signal Vref to the input terminal E140b of the transconductance amplifier 140.

Both of the embodiments of the electric amplifier circuit as shown in FIGS. 5A and 5B enable that the charge supplying circuit 120 supplies a charge at the output terminal A120 so that the potential at the output terminal A120 and the potential at the input node E110b of the differential amplifier are changed in the same manner as the potential is changed at the input terminal E10 of the electric amplifier circuit. A change of the potential at the input terminal E10 of the amplifier circuit 10 or the input terminal E110a of the differential amplifier circuit 110 may be compensated by a similar change of the potential at the input node E110b. The amplifier circuit 110 enables that a change of the potential at the input terminal E10 or E110a is transferred into a change of the common input level of the differential amplifier 110.

Many modifications and other embodiments set forth herein will come to mind to one skilled in the art to which the embodiments pertain having the benefit of the teachings presented in the foregoing descriptions and the associated drawings. Therefore, it is to be understood that the description and the claims are not to be limited to the specific embodiments disclosed and that modifications and other embodiments are intended to be included within the scope of the appended claims. It is intended that embodiments cover the modifications and variations of the embodiments provided they come within the scope of the appended claims and their equivalents. Although specific terms are employed herein, they are used in a generic and descriptive sense only and not for purposes of limitation.

The invention claimed is:

1. An electric amplifier circuit for amplifying an output signal of a microphone, comprising:
    a supply input terminal to apply a supply potential for operating the electric amplifier circuit;
    an input terminal to apply the output signal of the microphone;
    an output terminal to output an output signal of the amplifier circuit;
    a differential amplifier having a first input terminal for applying a first input signal, a second input terminal for applying a second input signal and an output terminal for outputting the output signal of the amplifier circuit, wherein the first input terminal of the differential amplifier is coupled to the input terminal of the amplifier circuit, and the output terminal of the differential amplifier is coupled to the output terminal of the amplifier circuit;
    a feedback path being coupled between the output terminal of the differential amplifier and the second input terminal of the differential amplifier; and
    a charge supplying circuit for supplying a charge, the charge supplying circuit being coupled to the feedback path,
    wherein the charge supplying circuit is configured to supply an amount of the charge to the feedback path in dependence on a change of the supply potential,
    wherein the charge supplying circuit comprises an electric storage circuit for storing the charge, and
    wherein the charge supplying circuit is configured such that the amount of charge being stored within the electric storage circuit is dependent on the change of the supply potential and the gain of the differential amplifier.

2. The electric amplifier circuit as claimed in claim 1, wherein the charge supplying circuit is configured to supply an amount of the charge to the feedback path in dependence on the gain of the differential amplifier.

3. The electric amplifier circuit as claimed in claim 1, wherein the electric storage circuit comprises at least one capacitor, and
    wherein the at least one capacitor has a first side being connectable with one of the supply potential and a reference potential, and a second side being connected to the feedback path.

4. The electric amplifier circuit as claimed in claim 3, wherein the electric storage circuit comprises a first capacitor, at least a second capacitor and a controllable switching circuit, and
    wherein the controllable switching circuit is configured to selectively connect the first side of the first capacitor to one of the supply potential and the reference potential, and to selectively connect the first side of the at least one second capacitor to one of the supply potential and the reference potential.

5. The electric amplifier circuit as claimed in claim 4, wherein the controllable switching circuit comprises a first inverter and at least a second inverter, each of the first and second inverters having a respective terminal to apply the supply potential and a respective terminal to apply the reference potential,
    wherein the first inverter has an output terminal coupled to the first side of the first capacitor,
    wherein the first inverter is configured to selectively couple one of the terminals to apply the supply potential and the reference potential to the output terminal of the first inverter in dependence on the gain of the differential amplifier, wherein the at least one second inverter has an output terminal coupled to the first side of the at least one second capacitor, and wherein the at least one second inverter is configured to selectively couple one of the terminals to apply the supply potential and the reference potential to the output terminal of the at least one second inverter in dependence on the gain of the differential amplifier.

6. The electric amplifier circuit as claimed in claim 5, wherein the charge supplying circuit comprises a control circuit having an input side to apply an input signal for the control circuit of the charge supplying circuit, a first output terminal to generate a first control signal, and at least a second output terminal to generate at least a second control signal, the input signal for the control circuit of the charge supplying circuit specifying the gain of the differential amplifier, wherein the first output terminal of the control circuit of the charge supplying circuit is coupled to a control terminal of the first inverter, wherein the first inverter is configured to selectively couple one of the terminals to apply the supply potential and the reference potential to the output terminal of the first inverter in dependence on the first control signal, wherein the at least one second output terminal of the control circuit of the charge supplying circuit is coupled to a control terminal of the at least one second inverter, and wherein the at least one second inverter is configured to selectively couple one of the terminals to apply the supply potential and the reference potential to the output terminal of the at least one second inverter in dependence on the second control signal.

7. The electric amplifier circuit as claimed in claim 1, comprising:

a transconductance amplifier having a first input terminal to apply a first input signal, a second input terminal to apply a second input signal, and an output terminal to generate an output signal, the output terminal being coupled to the second input terminal of the differential amplifier, wherein the transconductance amplifier is configured to generate an output signal of the transconductance amplifier in dependence on the first and second input signal of the differential amplifier, and wherein the charge supplying circuit has an output terminal for supplying the charge, the output terminal being connected to the output terminal of the transconductance amplifier.

8. The electric amplifier circuit as claimed in claim 7, wherein the first input terminal of the transconductance amplifier is coupled to the output terminal of the amplifier circuit, and wherein the second input terminal of the transconductance amplifier is coupled to a voltage source to a apply a reference potential or to the second input terminal of the differential amplifier.

9. The electric amplifier circuit as claimed in claim 7, comprising:

a capacitor being connected to the output terminal of the transconductance amplifier and the reference potential; and a voltage follower, wherein the voltage follower is arranged in the feedback path between the transconductance amplifier and the second input terminal of the differential amplifier.

10. The electric amplifier circuit as claimed in claim 9, wherein the first input terminal of the transconductance amplifier is coupled to the second input terminal of the differential amplifier, and wherein the second input terminal of the transconductance amplifier is coupled to an output terminal of the voltage follower.

11. The electric amplifier circuit as claimed in claim 1, comprising:

a first resistor; and a second resistor, wherein the first resistor is arranged in the feedback path between an output terminal of a voltage follower and the second input terminal of the differential amplifier, wherein the second resistor is directly connected to the output terminal of the differential amplifier and the second input terminal of the differential amplifier, and wherein the differential amplifier is configured such that the gain of the differential amplifier is dependent on the relationship between the first and second resistors.

12. The electric amplifier circuit as claimed in claim 11, comprising:

a control circuit to set the gain of the differential amplifier; and a storage circuit, wherein the first resistor is configured as a variable resistor, wherein the storage circuit is configured to store a value specifying the gain of the differential amplifier, wherein the control circuit is configured to set the resistance of the first resistor in dependence on the value stored in the storage circuit, and wherein the control circuit of the charge supplying circuit is configured to generate a first control signal and at least one second control signal in dependence on the value stored in the storage circuit.

13. A microphone chip, comprising:

an electric amplifier circuit as claimed in claim 7;

the microphone, wherein the microphone is connected to a supply output terminal and the input terminal of the amplifier circuit; and a package having a terminal to apply the supply potential, wherein the amplifier circuit and the microphone are housed in the package.

14. The microphone chip as claimed in claim 13, wherein the microphone is configured as a micro electromechanical system.

* * * * *